United States Patent
Song et al.

(10) Patent No.: US 11,670,373 B2
(45) Date of Patent: Jun. 6, 2023

(54) THREE-DIMENSIONAL MEMORY DEVICE PROGRAMMING WITH REDUCED THRESHOLD VOLTAGE SHIFT

(71) Applicant: YANGTZE MEMORY TECHNOLOGIES CO., LTD., Wuhan (CN)

(72) Inventors: Yali Song, Wuhan (CN); Xiangnan Zhao, Wuhan (CN); Yuanyuan Min, Wuhan (CN); Kaikai You, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 163 days.

(21) Appl. No.: 17/186,429

(22) Filed: Feb. 26, 2021

(65) Prior Publication Data

US 2022/0215883 A1    Jul. 7, 2022

Related U.S. Application Data

(63) Continuation of application No. PCT/CN2021/070088, filed on Jan. 4, 2021.

(51) Int. Cl.
*G11C 16/10* (2006.01)
*G11C 7/10* (2006.01)
(Continued)

(52) U.S. Cl.
CPC ............. *G11C 16/10* (2013.01); *G11C 7/1048* (2013.01); *G11C 16/0433* (2013.01);
(Continued)

(58) Field of Classification Search
CPC .................................................. G11C 16/0483
See application file for complete search history.

(56) References Cited

U.S. PATENT DOCUMENTS 11,205,493 B1 *  12/2021  Zainuddin ........... G11C 11/5671
2008/0158991 A1 *  7/2008  Hemink ............. G11C 16/3427
                                                    365/185.22
(Continued)

FOREIGN PATENT DOCUMENTS

CN    101552036 A    10/2009
CN    110660437 A    1/2020
(Continued)

OTHER PUBLICATIONS

International Search Report issued in corresponding International Application No. PCT/CN2021/070087, dated Sep. 30, 2021, 4 pages.

(Continued)

*Primary Examiner* — Douglas King
(74) *Attorney, Agent, or Firm* — Bayes PLLC

(57) ABSTRACT

A three-dimensional (3D) memory device may include a first set of memory layers, a second set of memory layers above the first set of memory layers, and a first dummy memory layer between the first and second sets of memory layers. The 3D memory device may further include a peripheral circuit that includes a word line (WL) driving circuit configured to when programming a first memory layer of the first set of memory layers, apply a first pre-charge voltage to the first dummy memory layer during a pre-charge period associated with the first memory layer, and when programming a second memory layer of the first set of memory layers located above the first memory layer, apply a second pre-charge voltage to the first dummy memory layer during a pre-charge period associated with the second memory layer. The first pre-charge voltage may be larger than the second pre-charge voltage.

20 Claims, 10 Drawing Sheets

(51) Int. Cl.
- *G11C 16/04* (2006.01)
- *G11C 16/08* (2006.01)
- *G11C 16/28* (2006.01)
- *G11C 16/30* (2006.01)
- *G11C 16/34* (2006.01)

(52) U.S. Cl.
CPC .............. *G11C 16/08* (2013.01); *G11C 16/28* (2013.01); *G11C 16/30* (2013.01); *G11C 16/3404* (2013.01)

(56) References Cited

U.S. PATENT DOCUMENTS

| | | | |
|---|---|---|---|
| 2008/0239812 A1* | 10/2008 | Abiko | G11C 11/5628 365/185.12 |
| 2009/0244967 A1* | 10/2009 | Kim | G11C 16/0483 365/185.2 |
| 2014/0340964 A1 | 11/2014 | Shiino et al. | |
| 2017/0125117 A1 | 5/2017 | Tseng et al. | |
| 2017/0140814 A1* | 5/2017 | Puthenthermadam | G11C 16/08 |
| 2019/0189218 A1* | 6/2019 | Izumi | G11C 16/08 |
| 2019/0267092 A1* | 8/2019 | Joe | G11C 16/32 |
| 2020/0006379 A1 | 1/2020 | Nishikawa et al. | |
| 2020/0168276 A1* | 5/2020 | Yang | G11C 16/3427 |
| 2020/0312413 A1 | 10/2020 | Wang et al. | |
| 2020/0381065 A1* | 12/2020 | Joe | G11C 16/0433 |
| 2021/0225866 A1 | 7/2021 | Lu et al. | |

FOREIGN PATENT DOCUMENTS

| CN | 110945592 A | 3/2020 |
|---|---|---|
| CN | 111033626 A | 4/2020 |

OTHER PUBLICATIONS

International Search Report issued in corresponding International Application No. PCT/CN2021/070088, dated Sep. 28, 2021, 4 pages.

* cited by examiner

600

WHEN PROGRAMMING A FIRST MEMORY LAYER OF THE FIRST SET OF MEMORY LAYERS, APPLYING A FIRST PRE-CHARGE VOLTAGE TO THE FIRST DUMMY MEMORY LAYER DURING A PRE-CHARGE PERIOD ASSOCIATED WITH THE FIRST MEMORY LAYER, THE FIRST SET OF MEMORY LAYERS BEING ABOVE THE FIRST DUMMY MEMORY LAYER — 602

WHEN PROGRAMMING A SECOND MEMORY LAYER OF THE FIRST SET OF MEMORY LAYERS LOCATED ABOVE THE FIRST MEMORY LAYER, APPLYING A SECOND PRE-CHARGE VOLTAGE TO THE FIRST DUMMY MEMORY LAYER DURING A PRE-CHARGE PERIOD ASSOCIATED WITH THE SECOND MEMORY LAYER, THE FIRST PRE-CHARGE VOLTAGE BEING LARGER THAN THE SECOND PRE-CHARGE VOLTAGE — 604

FIG. 6

THREE-DIMENSIONAL MEMORY DEVICE PROGRAMMING WITH REDUCED THRESHOLD VOLTAGE SHIFT

CROSS-REFERENCE TO RELATED APPLICATIONS

This application is a continuation of International Application No. PCT/CN2021/070088, filed on Jan. 4, 2021, entitled "THREE-DIMENSIONAL MEMORY DEVICE PROGRAMMING WITH REDUCED THRESHOLD VOLTAGE SHIFT," which is hereby incorporated by reference in its entirety. This application is also related to U.S. application Ser. No. 17/186,456, filed on Aug. 23, 2022, entitled "THREE-DIMENSIONAL MEMORY DEVICE PROGRAMMING WITH REDUCED DISTURBANCE," issued as U.S. Pat. No. 11,423,995, which is hereby incorporated by reference in its entirety.

BACKGROUND

The present disclosure relates to three-dimensional (3D) memory devices and operation methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device is disclosed. For example, in certain aspects, the 3D memory device may include a first set of memory layers, a second set of memory layers above the first set of memory layers, and a first dummy memory layer between the first and second sets of memory layers. In certain other aspects, the 3D memory device may further include a plurality of NAND memory strings each extending through the first and second set of memory layers and the first dummy memory layer. In certain other aspects, the 3D memory device may include a peripheral circuit configured to sequentially program each memory layer of the first set of memory layers, and then sequentially program each memory layer of the second set of memory layers. For example, the peripheral circuit may include a word line (WL) driving circuit configured to when programming a first memory layer of the first set of memory layers, apply a first pre-charge voltage to the first dummy memory layer during a pre-charge period associated with the first memory layer. In certain other aspects, the WL driving circuit may be further configured to when programming a second memory layer of the first set of memory layers located above the first memory layer, apply a second pre-charge voltage to the first dummy memory layer during a pre-charge period associated with the second memory layer. In certain aspects, the first pre-charge voltage may be larger than the second pre-charge voltage.

In another aspect, the 3D memory device may include a first set of memory layers, a second set of memory layers below the first set of memory layers, and a first dummy memory layer between the first and second sets of memory layers. In some aspects, the 3D memory device may further include a plurality of NAND memory strings each extending through the first and second set of memory layers and the first dummy memory layer. In some aspects, the 3D memory device may further include a peripheral circuit configured to sequentially program each memory layer of the first set of memory layers, and then sequentially program each memory layer of the second set of memory layers. In some aspects, the peripheral circuit includes a WL driving circuit configured to when programming a first memory layer of the first set of memory layers, apply a first pre-charge voltage to the first dummy memory layer during a pre-charge period associated with the first memory layer. In some aspects, the WL driving circuit may be further configured to when programming a second memory layer of the first set of memory layers located below the first memory layer, apply a second pre-charge voltage to the first dummy memory layer during a pre-charge period associated with the second memory layer. In some aspects, the first pre-charge voltage may be larger than the second pre-charge voltage.

In yet another aspect, a method for operating a 3D memory device is disclosed. In certain aspects, the 3D memory device may include a first set of memory layers, a second set of memory layers below the first set of memory layers, and a first dummy memory layer between the first and second sets of memory layers. In some aspects, the 3D memory device may further include a plurality of NAND memory strings each extending through the first and second set of memory layers and the first dummy memory layer. In some aspects, the method may include when programming a first memory layer of the first set of memory layers, applying a first pre-charge voltage to the first dummy memory layer during a pre-charge period associated with the first memory layer. In some aspects, the method may further include when programming a second memory layer of the first set of memory layers located above the first memory layer, applying a second pre-charge voltage to the first dummy memory layer during a pre-charge period associated with the second memory layer. In some aspects, the first pre-charge voltage may be larger than the second pre-charge voltage.

In still another aspect, a method for operating a 3D memory device is disclosed. In some aspects, the 3D memory device may include a first set of memory layers, a second set of memory layers below the first set of memory layers, and a first dummy memory layer between the first and second sets of memory layers. In some aspects, the 3D memory device may include a plurality of NAND memory strings each extending through the first and second set of memory layers and the first dummy memory layer. In some aspects, the method may include when programming a first memory layer of the first set of memory layers, applying a first pre-charge voltage to the first dummy memory layer during a pre-charge period associated with the first memory layer of the first set of memory layers. In some aspects, the method may include applying when programming a second memory layer of the first set of memory layers located below the first memory layer, a second pre-charge voltage to the first dummy memory layer during a pre-charge period associated with the second memory layer, In some aspects, the first pre-charge voltage is larger than the second pre-charge voltage.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

FIG. 6 is a flowchart of an exemplary method for reverse pre-charging and programming scheme for a 3D NAND memory device, according to some aspects of the present disclosure.

Figure 1:
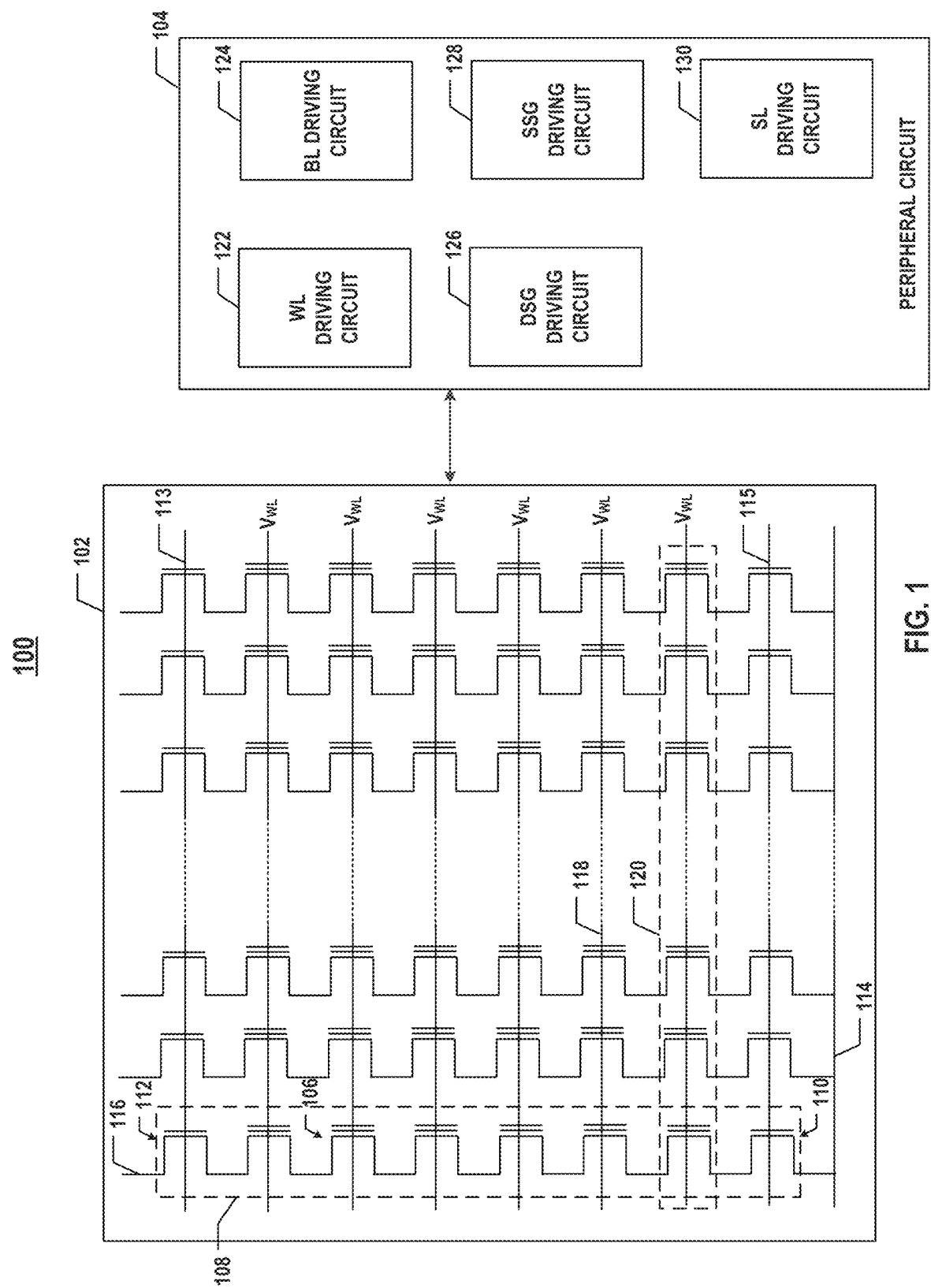
FIG. 1 illustrates a diagram of an exemplary 3D memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means perpendicular to the lateral surface of a substrate.

To increase the memory density of 3D memory devices, such as 3D NAND memory devices, multiple-deck architecture (e.g., dual-deck architecture) has been used to increasing the number of stacked memory layers. However, the multiple-deck architecture introduces some reliability issues, such as the reliability of the word line (a.k.a. edge word line) that is directly adjacent to the dummy word lines at the joint interface region between adjacent memory decks.

Channel hot electron (CHE) injection effect, during the memory operations, can de-trap the trapped charges in tunnel oxide, which in turn causes the shift of the threshold voltages (Vt) of memory cells (or dummy memory cells) at the memory layers, including the interface dummy word lines. The threshold voltage shift, in particular when shifting up at the interface dummy word lines, can cause reliability issues of the edge word line directly adjacent to the interface dummy word lines, such as shallow read, program disturbance, etc.

Known approaches to restrain the threshold voltage shift includes using the hold/release process in an erase operation to tune the shifted threshold voltage back. However, the relatively high release voltage (e.g., ~18 V) applied at the hold/release process to tune the threshold voltage may damage the interface dummy word lines because interface dummy word lines are at a structural weak point in 3D memory devices having multiple-deck architecture. The irregular shape of memory strings at the joint interface region between adjacent memory decks may weaken the stability and strength of interface dummy word lines compared with other word lines, thereby causing the breakdown of interface dummy word lines when a high release voltage is applied to the interface dummy word lines.

To address the aforementioned issues, the present disclosure introduces a solution in which the threshold voltage shift at the interface dummy word lines can be restrained without using the hold/release process in an erase operation. When programming the edge word line (the memory layer), a smaller pre-charge voltage (e.g., equal to or smaller than 0 V), compared with the pre-charge voltages used when programming earlier word lines, can be applied to the interface dummy word lines to reduce the CHE injection effect, thereby suppressing the threshold voltage shift at the interface dummy word lines. By eliminating the need for a high hold/release voltage for correcting the threshold voltage shift, the chance of breakdown at the interface dummy word lines can be reduced, and the device reliability can be improved.

FIG. 1 illustrates a diagram of an exemplary 3D memory device 100, according to some aspects of the present disclosure. 3D memory device 100 can include a memory array device 102 and a peripheral circuit 104 connected to memory array device 102. Memory array device 102 can be a 3D NAND Flash memory device in which memory cells 106 are provided in the form of an array of NAND memory strings 108 each extending vertically above a substrate (not shown). In some implementations, each NAND memory string 108 includes a plurality of memory cells 106 connected in series and stacked vertically. Each memory cell 106 can hold a continuous, analog value, such as an electrical voltage or charge, that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during reading and programming operations. In some implementations, SSGs 110 of NAND memory strings 108 in the same memory block are connected through a same source line (SL) 114, e.g., a common SL, for example, to the ground. DSG 112 of each NAND memory string 108 is connected to a respective bit line 116 from which data can be read via an output bus (not shown), according to some implementations. In some implementations, each NAND memory string 108 is configured to be selected or deselected by applying a select voltage (e.g., above the threshold voltage of the transistor having DSG 112) or a deselect voltage (e.g., 0 V) to respective DSG 112 through one or more DSG lines 113 and/or by applying a select voltage (e.g., above the threshold voltage of the transistor having SSG 110) or a deselect voltage (e.g., 0 V) to respective SSG 110 through one or more SSG lines 115.

Memory cells 106 of adjacent NAND memory strings 108 can be connected through word lines 118 that select which row of memory cells is affected by read, erase, and program operations. In some implementations, each word line 118 is connected to a page of memory cells (memory page 120), which is the smallest physically-addressable data unit for reading and programming operations. The size of memory page 120 in bits can correspond to the number of NAND memory strings 108 connected by word line 118. Each word line 118 can include a plurality of control gates at each memory cell 106 in respective memory page 120 and a gate line connecting the control gates.

Figure 2:
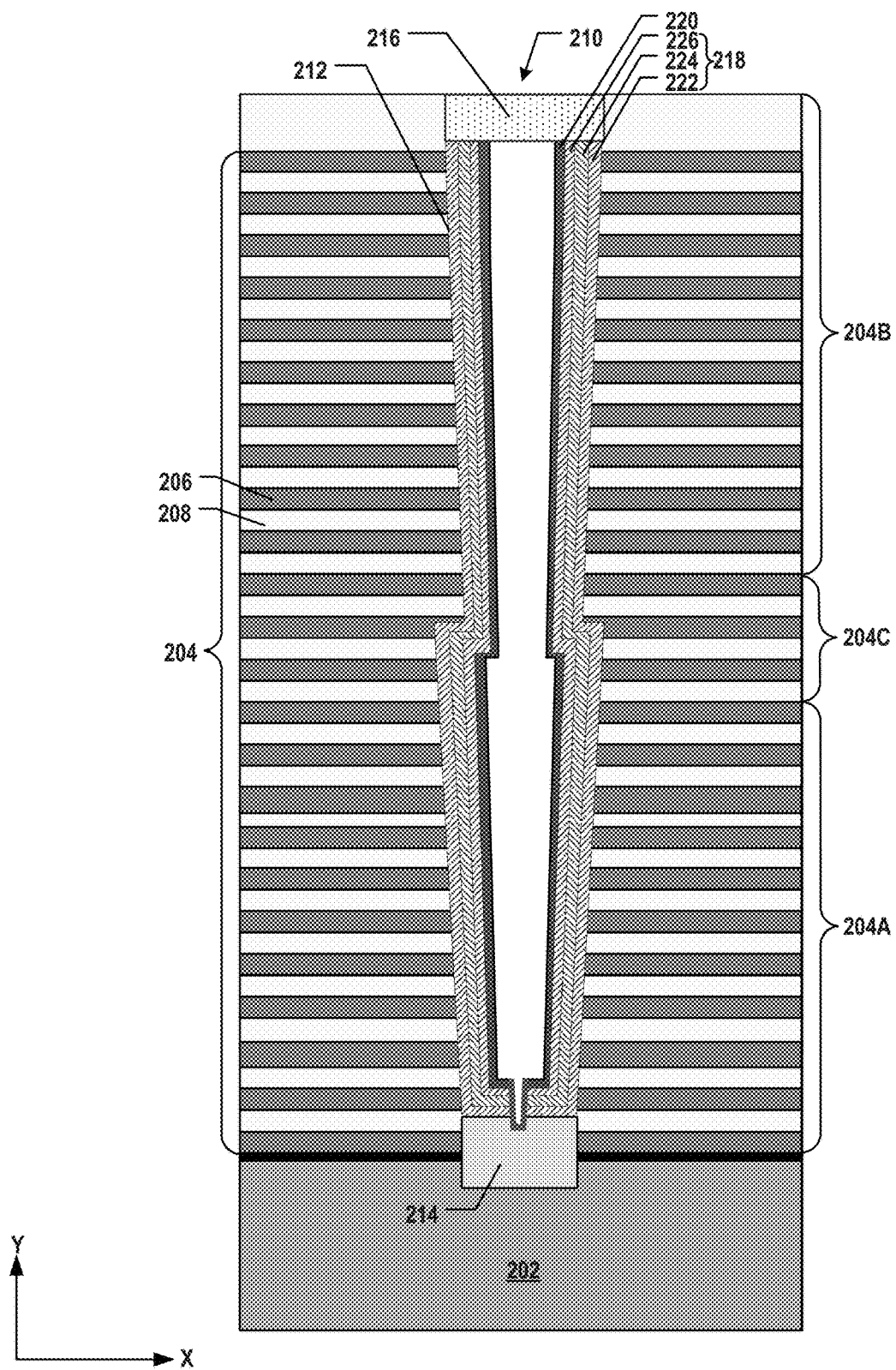
FIG. 2 illustrates a cross-section of an exemplary memory array device, according to some aspects of the present disclosure.

FIG. 2 illustrates a cross-section of an exemplary memory array device 200, according to some aspects of the present disclosure. Memory array device 200 is an example of memory array device 102 illustrated in FIG. 1. As shown in FIG. 2, memory array device 200 includes a 3D NAND memory string 210 (e.g., NAND memory string 108 in FIG. 1) extending vertically above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x and y axes are included in FIG. 2 to further illustrate the spatial relationship of the components in memory array device 200. Substrate 202 includes two lateral surfaces (e.g., a top surface and a bottom surface) extending laterally in the x-direction (i.e., the lateral direction). As used herein, whether one component is "on," "above," or "below" another component of a semiconductor structure (e.g., memory array device 200) is determined relative to the substrate of the semiconductor structure (e.g., substrate 202) in the y-direction (i.e., the vertical direction or depth direction) when the substrate is positioned in the lowest plane of the semiconductor structure in the y-direction. The same notion for describing the spatial relationship is applied throughout the present disclosure.

As shown in FIG. 2, 3D NAND memory string 210 extends vertically through a memory stack 204 having interleaved gate conductive layers 206 (also referred to herein as memory layers) and gate-to-gate dielectric layers 208 above substrate 202. Gate conductive layers 206 and gate-to-gate dielectric layers 208 in memory stack 204 can alternate in the vertical direction. In other words, except the ones at the top or bottom of memory stack 204, each gate conductive layer 206 can be adjoined by two gate-to-gate dielectric layers 208 on both sides, and each gate-to-gate dielectric layer 208 can be adjoined by two gate conductive layers 206 on both sides. The number of the pairs of gate conductive layers 206 and gate-to-gate dielectric layers 208 in memory stack 204 (e.g., 32, 64, 96, or 128) determines the number of memory cells in memory array device 200. Each gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer/memory layer 206 can include control gates surrounding the memory cells (e.g., memory cells 106 in FIG. 1) of 3D NAND memory string 210 and can extend laterally as a word line (e.g., word lines 118 in FIG. 1).

Memory stack 204 can have a multi-deck architecture, such as a dual-deck memory stack including a lower memory deck 204A above substrate 202 and an upper memory deck 204B above lower memory deck 204A, as shown in FIG. 2. The numbers of the pairs of gate conductive layers 206 and gate-to-gate dielectric layers 208 in each of lower and upper memory decks 204A and 204B can be the same or different. Each of lower and upper memory decks 204A and 204B can include interleaved gate conductive layers 206 and gate-to-gate dielectric layers 208 as described above.

As shown in FIG. 2, 3D NAND memory string 210 includes a channel structure 212 extending vertically through lower and upper memory decks 204A and 204B. In some implementations, channel structure 212 includes a channel hole filled with semiconductor material(s) (e.g., as a semiconductor channel 220) and dielectric material(s) (e.g., as a memory film 218). In some implementations, semiconductor channel 220 includes silicon, such as amorphous silicon, polysilicon, or single crystalline silicon. In some implementations, memory film 218 is a composite dielectric layer including a tunneling layer 226, a storage layer 224 (also known as a charge trap/storage layer), and a blocking layer 222. Channel structure 212 can have a cylinder shape (e.g., a pillar shape). Semiconductor channel 220, tunneling layer 226, storage layer 224, blocking layer 222 are arranged radially from the center toward the outer surface of the pillar in this order, according to some implementations. Tunneling layer 226 can include silicon oxide, silicon oxynitride, or any combination thereof. Storage layer 224 can include silicon nitride, silicon oxynitride, silicon, or any combination thereof. Blocking layer 222 can include silicon oxide, silicon oxynitride, high dielectric constant (high-k) dielectrics, or any combination thereof. In one example, memory film 218 can include a composite layer of silicon oxide/silicon oxynitride/silicon oxide (ONO).

In some implementations, 3D NAND memory string 210 further includes a semiconductor plug 214 in the lower portion (e.g., at the lower end) of 3D NAND memory string 210. Semiconductor plug 214 can include a semiconductor material, such as single-crystal silicon, which is epitaxially grown from substrate 202 in any suitable direction. Semiconductor plug 214 can function as part of the channel of a source select transistor (e.g., the transistor having SSG 110 in FIG. 1) of 3D NAND memory string 210. In some implementations, 3D NAND memory string 210 further includes a channel plug 216 in the upper portion (e.g., at the upper end) of 3D NAND memory string 210. In some implementations, channel plug 216 can function as the channel of a drain select transistor (e.g., the transistor having DSG 112 in FIG. 1) of 3D NAND memory string 210. As used herein, the upper end of a component (e.g., channel structure 212) is the end farther away from substrate 202 in the y-direction, and the lower end of the component (e.g., channel structure 212) is the end closer to substrate 202 in they-direction when substrate 202 is positioned in the lowest plane of memory array device 200.

In some implementations, 3D NAND memory strings 210 include a plurality of control gates (each being part of gate conductive layer/memory layer 206) for memory cells of 3D NAND memory strings 210. Gate conductive layer 206 can include multiple control gates for multiple 3D NAND memory strings 210 and can extend laterally as a word line ending at the edge of memory stack 204, which can receive word line bias voltages $V_{WL}$ (e.g., as shown in FIG. 1) for controlling operations of the memory cells, e.g., by reading, erasing, and programming operations. It is understood that although not shown in FIG. 2, additional components of memory array device 200 can be formed including, but not limited to, gate line slits/source contacts, local contacts, interconnect layers, etc.

In FIG. 2, 3D NAND memory string 210 includes single channel structure 212, which is known as a single-cell formation (SCF) structure. It is understood that in some implementations, 3D NAND memory string 210 may include two channel structures electrically connected by an inter-deck plug (not shown), which is also known as a dual-cell formation (DCF) structure. It is also understood that in some implementations, memory stack 204 may include more than two memory decks, and 3D NAND memory string 210 may include a single channel structure extending vertically through the memory decks or include more than two channel structures, each of which extends vertically through a respective one of the memory decks. For a 3D memory device having a multi-deck memory stack, each of the multiple memory decks can include a plurality of memory layers (e.g., gate conductive layers 206) in the vertical direction. In some implementations, a set of dummy memory layers (interface dummy memory layers) are formed vertically between adjacent memory decks, such as dummy memory layers 204C vertically between lower and upper memory decks 204A and 204B as shown in FIG. 2, or dummy memory layers (not shown) surrounding the inter-deck plug in a DCF structure. A dummy memory layer can have the same physical structure, but different electrical configuration as a memory layer because the memory cells connected by the dummy memory layer are not used for data storage (i.e., as dummy memory cells).

Referring back to FIG. 1, peripheral circuit 104 can include any suitable digital, analog, and/or mixed-signal circuits used for facilitating the operations of 3D memory device 100. For example, peripheral circuit 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some implementations, peripheral circuit 104 is formed using complementary metal-oxide-semiconductor (CMOS) technology.

In some implementations, peripheral circuit 104 may include, among others, a word line (WL) driving circuit 122, a bit line (BL) driving circuit 124, a drain select gate (DSG) driving circuit 126, a source select gate (SSG) driving circuit 128, and a source line (SL) driving circuit 130. One or more of WL driving circuit 122, BL driving circuit 124, DSG driving circuit 126, SSG driving circuit 128, and SL driving circuit 130 may implement the programming schemes disclosed herein for programming memory cells 106 in memory array device 102. The waveform of the programming scheme can be provided by peripheral circuit 104 to each memory page 120 through word lines 118 in the form of word line bias voltages $V_{WL}$. As described below in detail, the WL bias voltages $V_{WL}$ that may be applied to word lines 118 include a pre-charge voltage $V_{pre-charge}$, program voltage $V_{PGM}$, channel pass voltage $V_{pass}$, cut-off voltage $V_{cut}$, etc. DSG driving circuit 126 and/or SSG driving circuit 128 may select or deselect each NAND memory string 108 (and memory cells 106 thereof) by applying a select voltage or a deselect voltage to DSG 112 and/or SSG 110, respectively. DSG driving circuit 126 can also apply pre-charge voltages to DSG 112 via DSG line 113 in forward programming, and SSG driving circuit 128 can also apply pre-charge voltages to SSG 110 via SSG line 115 in reverse programming, as described below in detail. BL driving circuit 124 can apply BL bias voltage to the drain end of NAND memory string 108 via BL 116 in forward programming, and SL driving circuit 130 can apply an SL bias voltage to the source end of NAND memory string 108 via SL 114 in reverse programming, as described below in detail.

Figure 3A:
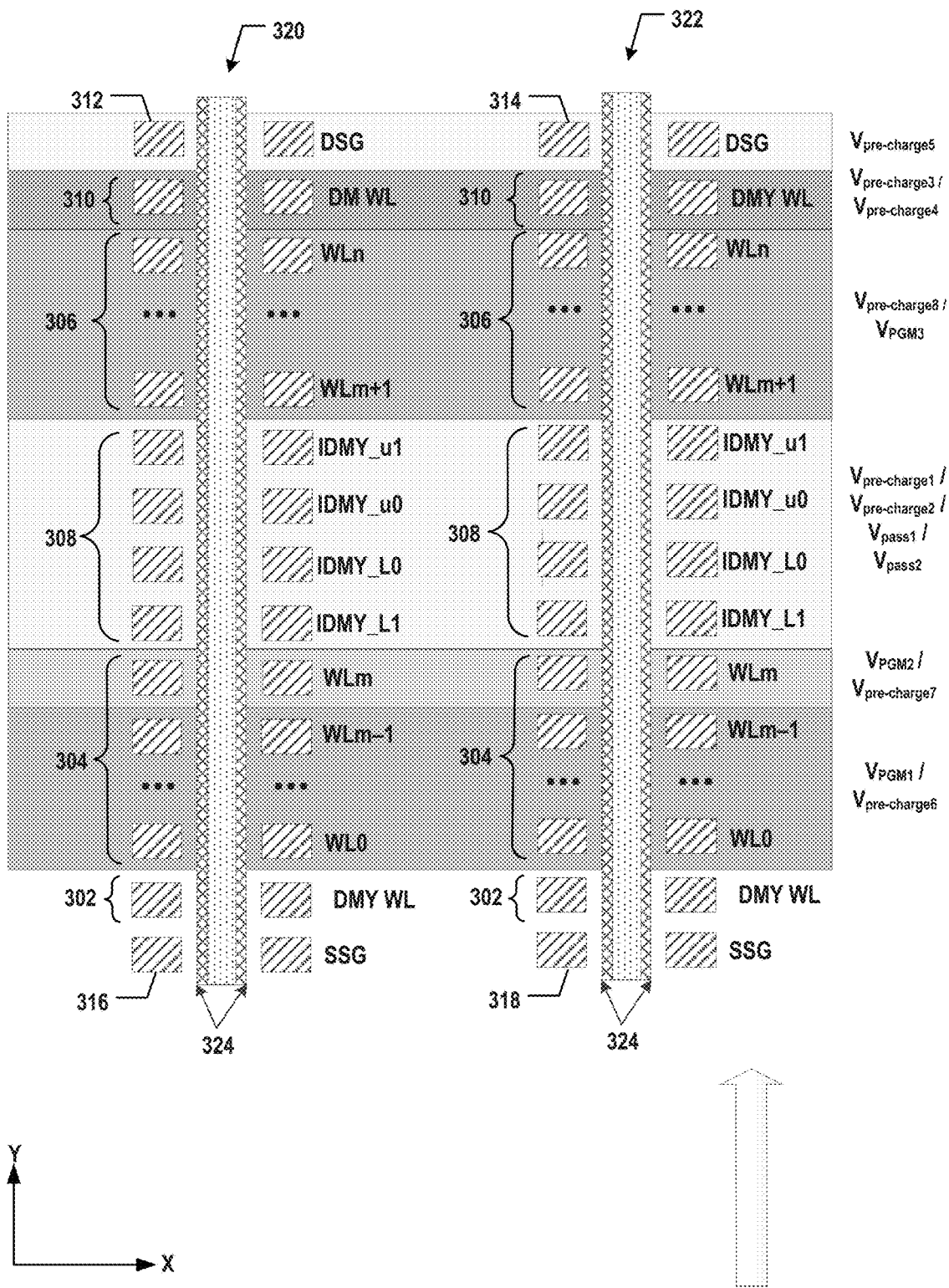
FIG. 3A illustrates a forward pre-charging and programming scheme for a 3D NAND memory device, according to some aspects of the present disclosure.
Figure 3B:
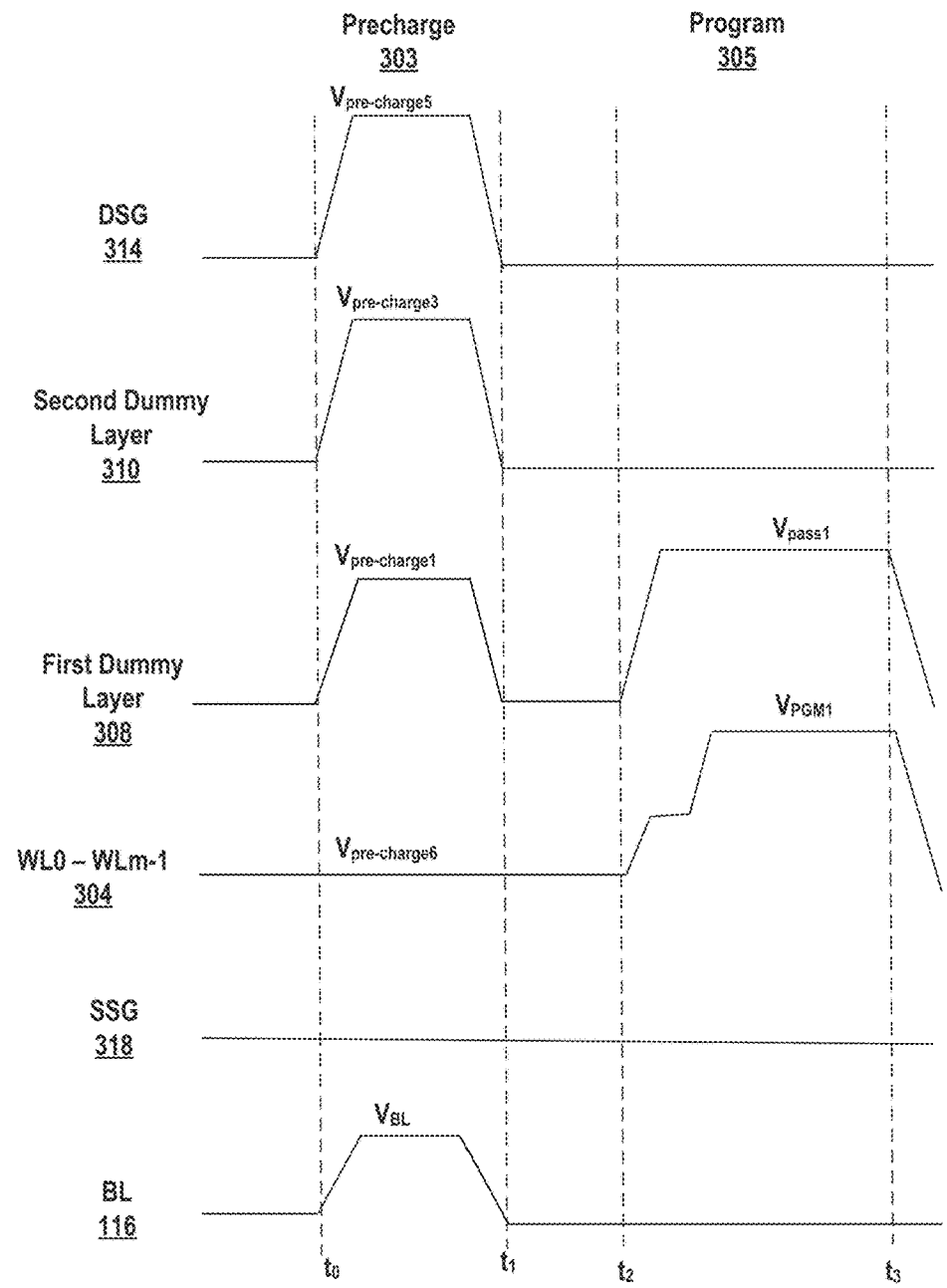
FIG. 3B illustrates a first waveform associated with the forward pre-charging and programming scheme for the 3D NAND memory device, according to some aspects of the present disclosure.
Figure 3C:
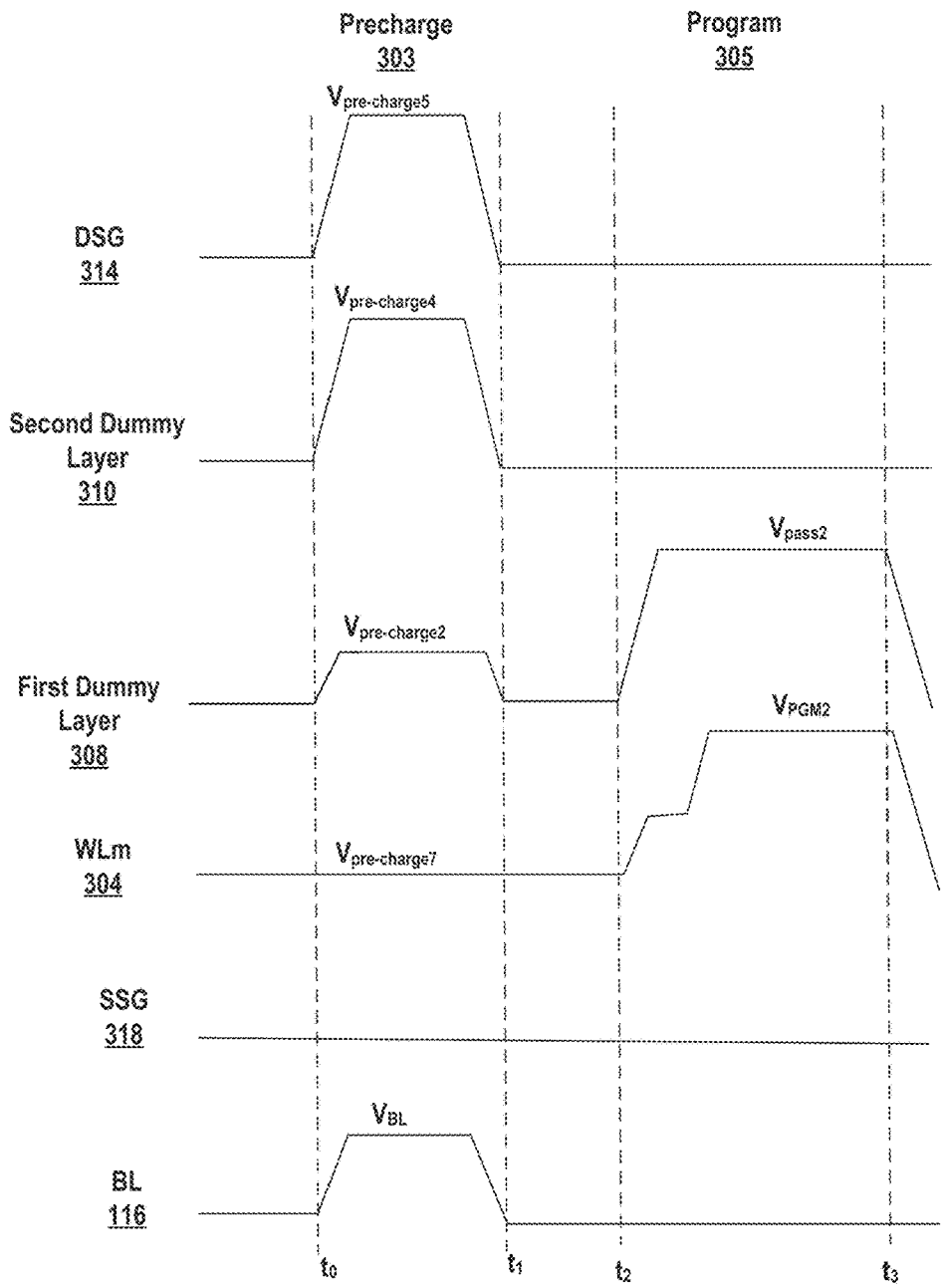
FIG. 3C illustrates a second waveform associated with the forward pre-charging and programming scheme for the 3D NAND memory device, according to some aspects of the present disclosure.

FIG. 3A illustrates a forward programming scheme for a 3D NAND memory device 300, according to certain aspects of the present disclosure. FIG. 3B illustrates a first programming waveform 301 associated with 3D NAND memory device 300 of FIG. 3A, according to certain aspects of the present disclosure. FIG. 3C illustrates a second programming waveform 315 associated with the first set of memory layers of 3D NAND memory device 300 of FIG. 3A, according to certain aspects of the present disclosure. FIGS. 3A-3C will now be described together.

Referring to FIG. 3A, 3D NAND memory device 300 includes a memory stack with, e.g., a plurality of memory layers 302, 304, 306, 308, and 310 (e.g., gate conductive layers) in the vertical direction. In certain implementations, the memory stack may be arranged with a first set of memory layers 304 (e.g., in lower memory deck 204A in FIG. 2) and a second set of memory layers 306 (e.g., in upper memory deck 204B in FIG. 2). As illustrated in FIG. 3A, each memory layer in first set of memory layers 304 may be associated with a respective word line, e.g., such as WL0-WLm. Furthermore, each memory layer in second set of memory layers 306 also may be associated with a respective word line, e.g., such as WLm+1-WLn.

Still further, each memory layer in 3D NAND memory device 300 may be associated with a programming cycle. A programming cycle may include, among others, a pre-charge period 303 and a program period 305. In the forward programming scheme, each memory layer in first set of memory layer 304 may be sequentially programmed prior to sequentially programming each memory layer in second set of memory layers 306. For example, as shown in FIG. 3A, the forward programming scheme may follow the positive y-direction. As used herein, when programming a memory layer, the memory cell associated with and/or controlled by the memory layer is programmed. To suppress voltage shift in, for example, a selected NAND memory string 320 and/or a deselected NAND memory string 322, pre-charge voltages may be applied to various layers across the selected NAND memory string 320 and/or deselected NAND memory string 322 prior to program period 305.

By way of example and not limitation, the first programming cycle may begin with the memory layer associated with WL0 before moving on to a second programming cycle for the memory layer associated with WL1, and so on. That is, to program the memory layer associated with WL0 in selected NAND memory string 320, pre-charge voltages are first applied to various layers across both selected NAND memory string 320 and deselected NAND memory string 322 of 3D NAND memory device 300. Then, a program voltage is applied to WL0 to program the associated first memory cell in selected NAND memory string 320. Once the first memory cell is programmed in selected NAND memory string 320, a programming cycle for the memory cell associated with WL1 may begin. Each time a memory cell is programmed in selected NAND memory string 320, residual electrons may accumulate in a channel 324 (corresponding to semiconductor channel 220 in FIG. 2) of deselected NAND memory string 322. Hence, for each subsequent memory layer, positive pre-charge voltages may be applied to the subsequent memory layer to remove the residual electrons accumulated during the program cycle of the previous memory layer. In this way, program disturbances in the deselected NAND memory string 322 may be reduced and/or avoided entirely. Furthermore, to avoid a threshold voltage shift at the memory cell associated with WLm (e.g., the memory cell in first set of memory layers 304 directly adjacent to a first dummy memory layer 308), the pre-charge voltage applied to first dummy memory layer 308 associated with interface dummy WLs, such as IDMY_L1-IDMY_u1, (e.g., an example of dummy memory layers 204C in FIG) may be smaller when programming WLm than when programming WL0 to WLm−1 as described below in detail.

Still referring to FIG. 3A, first dummy memory layer 308, such as interface dummy word lines (IDM_L1-IDMY_u1), may be located between first set of memory layers 304 and second set of memory layers 306. As shown in FIG. 3A, 3D NAND memory device 300 also includes a plurality of NAND memory strings (e.g., selected NAND memory string 320 and deselected NAND memory string 322), each extending vertically through the memory stack. Each NAND memory string 320 or 322 includes a drain select gate (DSG) 312 or 314 above second dummy memory layer(s) 310, such as drain dummy word lines (DMY WL). Each NAND memory string 320 or 322 also includes a source select gate (SSG) 316 or 318 below third dummy memory layer(s) 302, such as source dummy word lines (DMY WL). A forward programming operation (e.g., programming in the direction from SSG 316/318 to DSG 312/314) may be performed to program one or more memory layers across selected NAND memory string 320. It is understood that each of first, second, and third dummy memory layers 308, 310, and 302 referred to herein may include one or more dummy memory layers.

As illustrated in FIG. 3B, the forward programming scheme may apply a pre-charge voltage $V_{pre-charge5}$ to DSG 312 or 314 and a BL voltage $V_{BL}$ to BL 116 to turn on selected NAND memory string 320 and deselected NAND memory string 322 during pre-charge period 303. In certain implementations, DSG driving circuit 126 may apply $V_{pre-charge5}$ to DSG 314 via DSG line 113 connected to selected NAND memory string 320 and deselected NAND memory string 322. In certain other implementations, BL driving circuit 124 may apply $V_{BL}$ to a first BL connected to selected NAND memory string 320 and to a second BL connected to deselected NAND memory string 322.

As mentioned above, the forward programming scheme may include a plurality of programming cycles, one for each of the memory layers in 3D NAND memory device 300. Each of the programming cycles may include, among others, pre-charge period 303 and program period 305. In the example(s) illustrated in FIGS. 3B and 3C, pre-charge period 303 may be the time period between $t_0$ and $t_2$. During pre-charge period 303, a potential difference may be created in channel 324 of one or more of selected NAND memory string 320 or deselected NAND memory string 322. The potential may draw residual electrons in channel 324 towards the drain end (e.g., towards DSG 312 or 314) by applying various pre-charge voltages to different layers across selected NAND memory string 320 and deselected NAND memory string 322. Program period 305 may be the time period between $t_2$ and $t_3$. During program period 305, an associated memory cell in selected NAND memory string 320 may be programmed, and the coupling potential may be generated in deselected NAND memory string 322 to prevent programming a memory cell in deselected NAND memory string 322 at the same memory layer.

Referring to FIG. 3B, WL driving circuit 122 may apply a first pre-charge voltage $V_{pre-charge1}$ to first dummy memory layer 308 during pre-charge period 303 in a programming cycle when programming a first memory layer in first set of memory layers 304 (e.g., one of WL0-WLm−1). Furthermore, referring to FIG. 3C, WL driving circuit 122 may apply a second pre-charge voltage $V_{pre-charge2}$ to first dummy memory layer 308 during pre-charge period 303 associated with a programming cycle of a second memory layer (e.g., a memory cell associated with WLm, an edge word line) in first set of memory layers 304 located above the first memory layer (e.g., memory cell associated with one of WL0-WLm−1).

When programming the memory layer associated with WLm, i.e., the memory layer directly adjacent to first dummy memory layer 308, a positive bias voltage during the pre-charge period can exacerbate the CHE injection effect, which is the root of threshold voltage shift at first dummy memory layer 308. Thus, by reducing $V_{pre-charge2}$ applied to first dummy memory layer 308 when programming the memory layer associated with WLm, for example, being smaller than $V_{pre-charge1}$ when programming other memory layers in first set of memory layers 304, the threshold voltage increase at first dummy memory layer 308 can be reduced as well. In other words, by applying a smaller pre-charge voltage to first dummy memory layer 308 when programming the memory layer in first set of memory layers 304 that is directly adjacent to first dummy memory layer 308 than when programming any other memory layers in first set of memory layers 304, the threshold voltage increase at first dummy memory layer 308 can be suppressed.

In some implementations, $V_{pre-charge1}$ may be equal to or larger than the threshold voltage associated with first dummy memory layer 308, e.g., the threshold voltage of the dummy memory cell transistor on first dummy memory layer 308. In contrast, $V_{pre-charge2}$ may be less than the threshold voltage associated with first dummy memory layer 308, such that $V_{pre-charge2}$ is lower compared with $V_{pre-charge1}$ to reduce the threshold voltage increase at first dummy memory layer 308. In some implementations, first dummy memory layer 308 may include multiple dummy memory layers, such as 4 dummy memory layers IDMY_L1 to IDMY_u1 shown in FIG. 3A, each of which is associated with a threshold voltage. In this case, $V_{pre-charge1}$ may be equal to or larger than the maximum one of the threshold voltages, while $V_{pre-charge2}$ may be less than the minimum one of the threshold voltages. In some implementations, the threshold voltage(s) may be between 2 V and 3V, and $V_{pre-charge2}$ may be less than or equal to 2 V. In some implementations, $V_{pre-charge2}$ may be less than or equal to 0 V, i.e., a non-positive bias voltage, to avoid attracting and accumulating electrons, which is one cause of CHE injection effect.

Referring to FIG. 3B, WL driving circuit 122 may apply a third pre-charge voltage $V_{pre-charge3}$ to second dummy memory layer 310 during pre-charge period 303 when programming the first memory layer in first set of memory layers 304 (e.g., memory cell associated with one of WL0-WLm−1). Referring to FIG. 3C, WL driving circuit 122 may apply a fourth pre-charge voltage $V_{pre-charge4}$ to second dummy memory layer 310 during pre-charge period 303 when programming the second memory layer (e.g., memory cell associated with WLm).

Furthermore, as seen in FIG. 3B, WL driving circuit 122 may apply a sixth pre-charge voltage $V_{pre-charge6}$ to the first memory layer in first set of memory layers 304 during pre-charge period 303 when programming the first memory layer. $V_{pre-charge4}$ may be applied in such a way that the potential difference within channel 324 is enhanced, or at least not affected by the application of $V_{pre-charge6}$. For example, $V_{pre-charge6}$ may be less than or equal to 0 V. Similarly, as seen in FIG. 3C, WL driving circuit 122 may apply a seventh pre-charge voltage $V_{pre-charge7}$ to the second memory layer (e.g., memory cell associated with one of WLm) during pre-charge period 303 when programming the second memory layer. $V_{pre-charge7}$ may be applied in such a way that the potential within channel 324 is enhanced, or at least not affected by the application of $V_{pre-charge7}$. For example, $V_{pre-charge7}$ may be less than or equal to 0 V.

As seen in FIGS. 3B and 3C, during program period 305, for deselected NAND memory string 322, because DSG 314 and SSG 318 at each end thereof are turned off, channel 324 of deselected NAND memory string 322 is in a floating state. Referring to FIG. 3B, during the programming of the first memory layer (e.g., memory cell associated with one of WL0-WLm−1) in selected NAND memory string 320, because the memory layers of memory pages 120 surround both selected NAND memory string 320 and deselected NAND memory string 322, first channel pass voltage $V_{pass1}$ applied to each of the rest of the memory layers forms a coupling potential in deselected NAND memory string 322 to suppress the programming of a memory cell in deselected NAND memory string 322 due to the first program voltage $V_{PGM1}$ used to program a memory cell (e.g., associated with the first memory layer) in selected NAND memory string 320. For example, when $V_{PGM1}$ is applied to WLm−1 to program the associated memory cell in selected NAND memory string 320, $V_{pass1}$ may be applied to WL0-WLm−2, WLm-WLn, and first dummy memory layer 308.

Referring to FIG. 3C, when programming of the second memory layer (e.g., memory cell associated with one of WLm) in selected NAND memory string 320, because the memory layers of memory pages 120 surround both selected NAND memory string 320 and deselected NAND memory string 322, second channel pass voltage $V_{pass2}$ applied to each of the rest of the memory layers forms a coupling potential in deselected NAND memory string 322 to suppress the programming of a memory cell in deselected NAND memory string 322 due to the second program voltage $V_{PGM2}$ used to program a memory cell (e.g., associated with the second memory layer) in selected NAND memory string 320. For example, when $V_{PGM2}$ is applied to WLm to program the associated memory cell in selected NAND memory string 320, $V_{pass2}$ may be applied to WL0-WLm-1, WLm+1-WLn, and first dummy memory layer 308.

Furthermore, in FIGS. 3B and 3C, during program period 305, a deselect voltage (e.g., 0V) may be applied to DSG 314 and SSG 318 to deselect NAND memory string 322 while programming the memory cells of selected NAND memory string 320.

It is understood that when programing each memory layer in second set of memory layers 306 using the forward programming scheme, the same waveforms shown in FIG. 3C may be applied, e.g., with a reduced pre-charge voltage $V_{pre-charge2}$. That is, the same waveforms shown in FIG. 3C may be used for programming each of the memory layers associated with WLm to WLn, and the same waveforms shown in FIG. 3B may be sued for programming each of the memory layers associated with WL0 to WLm-1.

Figure 4A:
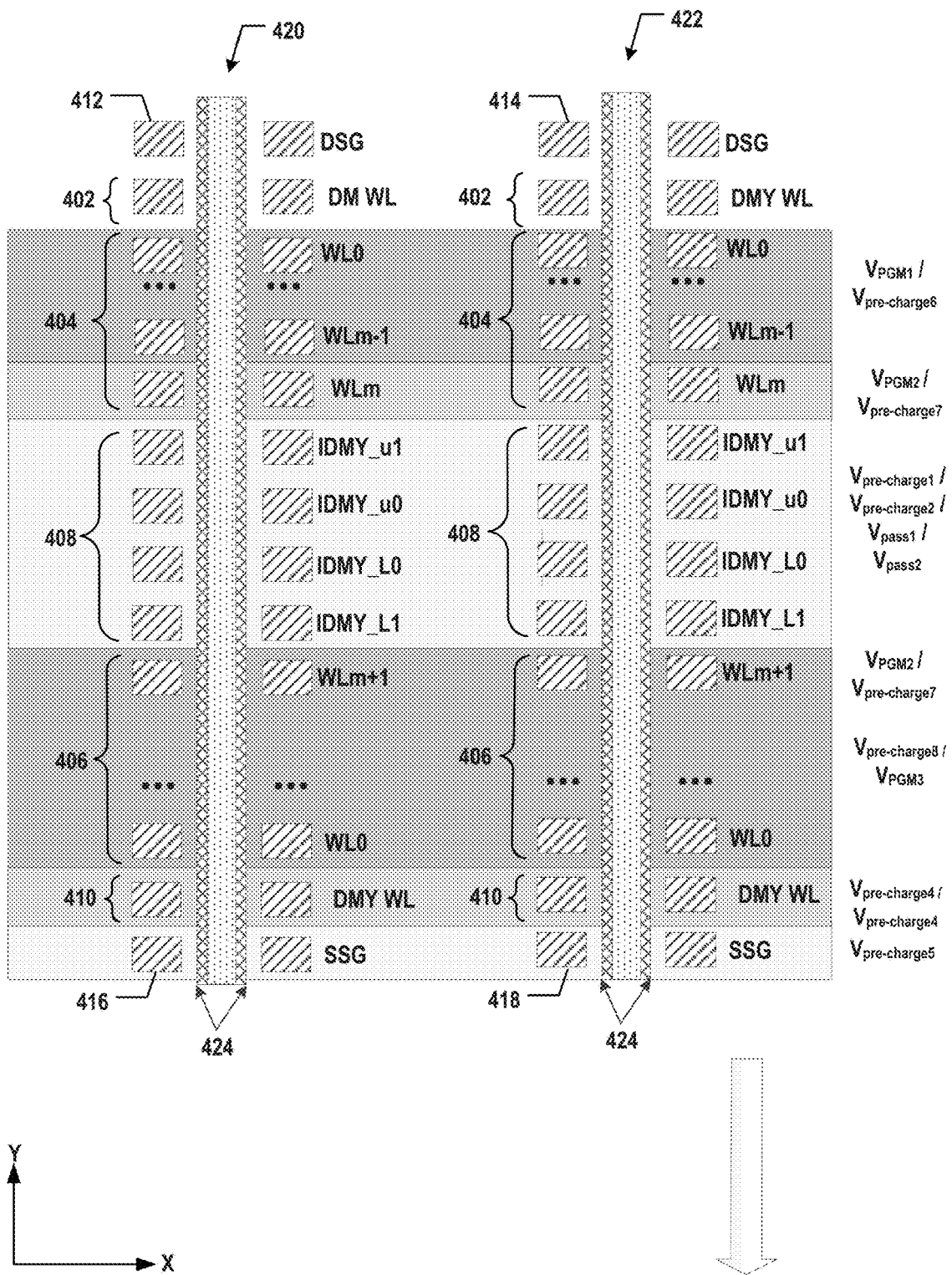
FIG. 4A illustrates a reverse pre-charging and programming scheme for a 3D NAND memory device, according to some aspects of the present disclosure.
Figure 4B:
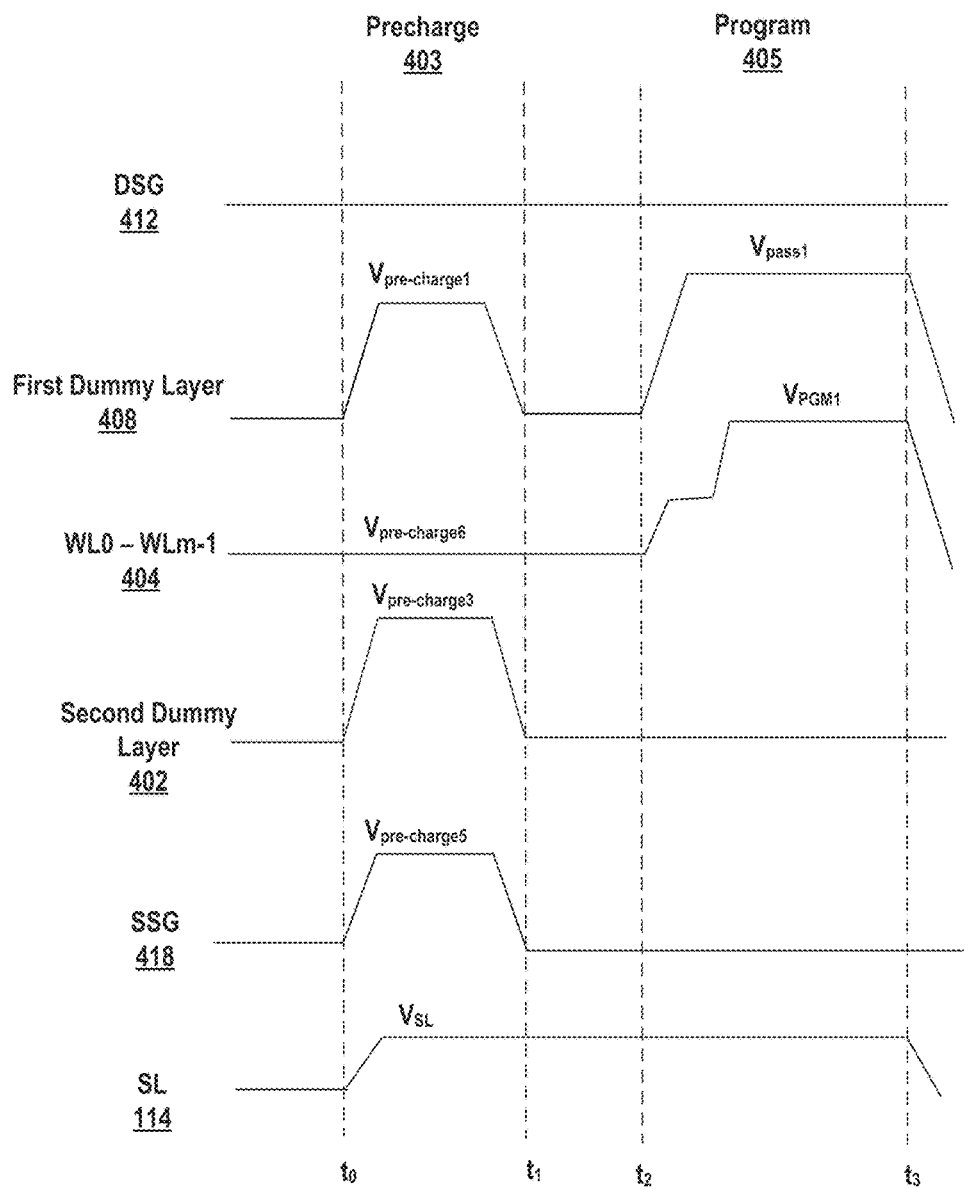
FIG. 4B illustrates a first waveform associated with the reverse pre-charging and programming scheme for the 3D NAND memory device, according to some aspects of the present disclosure.
Figure 4C:
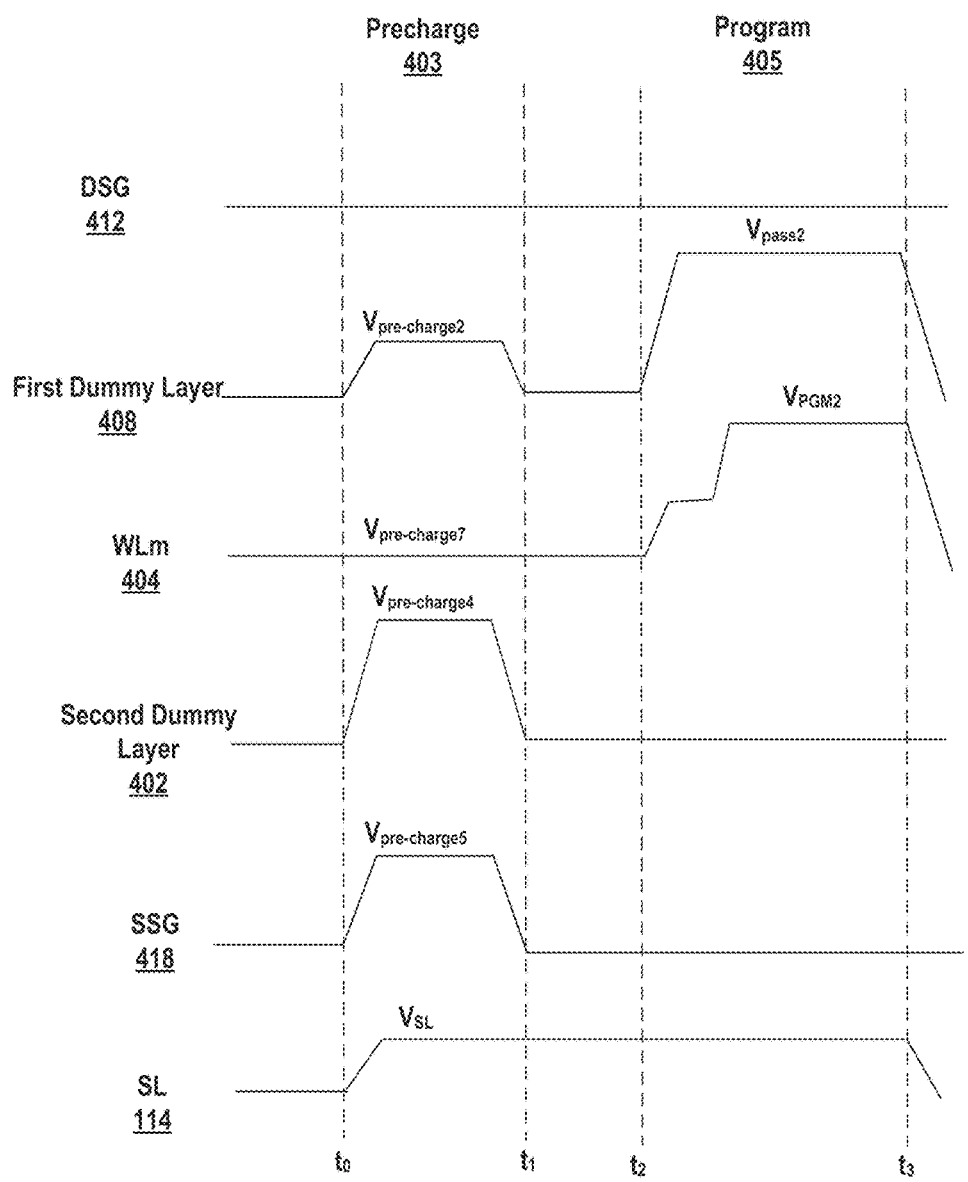
FIG. 4C illustrates a second waveform associated with the reverse pre-charging and programming scheme for the 3D NAND memory device, according to some aspects of the present disclosure.

FIG. 4A illustrates a reverse programming scheme for a 3D NAND memory device 400, according to certain aspects of the present disclosure. FIG. 4B illustrates a first programming waveform 401 associated with 3D NAND memory device 400 of FIG. 4A, according to certain aspects of the present disclosure. FIG. 4C illustrates a second programming waveform 415 associated with the first set of memory layers of 3D NAND memory device 400 of FIG. 4A, according to certain aspects of the present disclosure. FIGS. 4A-4C will now be described together.

Referring to FIG. 4A, 3D NAND memory device 400 includes a memory stack with, e.g., a plurality of memory layers 402, 404, 406, 408, and 410 (e.g., gate conductive layers) in the vertical direction. In certain implementations, the memory stack may be arranged with a first set of memory layers 404 (e.g., in upper memory deck 204B in FIG. 2) and a second set of memory layers 406 (e.g., in lower memory deck 204A in FIG. 2). As illustrated in FIG. 4A, each memory layer in first set of memory layers 404 may be associated with a respective word line, e.g., such as WL0-WLm. Furthermore, each memory layer in second set of memory layers 406 also may be associated with a respective word line, e.g., such as WLm+1-WLn.

Still further, each memory layer in 3D NAND memory device 400 may be associated with a programming cycle. A programming cycle may include, among others, a pre-charge period 403 and a program period 405. In the reverse programming scheme, each memory layer in first set of memory layer 404 may be sequentially programmed prior to sequentially programming each memory layer in second set of memory layers 406. For example, as shown in FIG. 4A, the reserve programming scheme may follow the negative y-direction. To suppress voltage shift in, for example, a selected NAND memory string 420 and/or a deselected NAND memory string 422, pre-charge voltages may be applied to various layers across the selected NAND memory string 420 and/or deselected NAND memory string 422 prior to program period 405.

By way of example and not limitation, the first programming cycle may begin with the memory layer associated with WL0 before moving on to a second programming cycle for the memory layer associated with WL1, and so on. That is, to program (the memory layer associated with WL0 in selected NAND memory string 420, pre-charge voltages are first applied to various layers across both selected NAND memory string 420 and deselected NAND memory string 422 of 3D NAND memory device 400. Then, a program voltage is applied to WL0 to program the associated first memory cell in selected NAND memory string 420. Once the first memory cell is programmed in selected NAND memory string 420, a programming cycle for the memory cell associated with WL1 may begin. Each time a memory cell is programmed in selected NAND memory string 420, residual electrons may accumulate in a channel 424 (corresponding to semiconductor channel 220 in FIG. 2) of deselected NAND memory string 422. Hence, for each subsequent memory layer, positive pre-charge voltages may be applied to the subsequent memory layer to remove the residual electrons accumulated during the program cycle of the previous memory layer. In this way, program disturbances in the deselected NAND memory string 422 may be reduced and/or avoided entirely. Furthermore, to avoid a threshold voltage shift at the memory cell associated with WLm (e.g., the memory cell in first set of memory layers 404 directly adjacent to a first dummy memory layer 408), the pre-charge voltage applied to first dummy memory layer 408 associated with interface dummy WLs, such as IDMY_L1-IDMY_u1, (e.g., an example of dummy memory layers 204C in FIG) may be smaller when programming WLm than when programming WL0 to WLm-1 as described below in detail.

Still referring to FIG. 4A, first dummy memory layer 408, such as interface dummy word lines (IDMY_L1-IDMY_u1), may be located between first set of memory layers 404 and second set of memory layers 406. As shown in FIG. 4A, 3D NAND memory device 400 also includes a plurality of NAND memory strings (e.g., selected NAND memory string 420 and deselected NAND memory string 422), each extending vertically through the memory stack. Each NAND memory string 420 or 422 includes a drain select gate (DSG) 412 or 414 above third dummy memory layer(s) 402, such as drain dummy word lines (DMY WL). Each NAND memory string 420 or 422 also includes a source select gate (SSG) 416 or 418 above second dummy memory layer(s) 410, such as source dummy word lines (DMY_WL). A reverse programming operation (e.g., programming in the direction from DSG 412/414 to SSG 416/418) may be performed to program one or more memory layers across selected NAND memory string 420. It is understood that each of first, second, and third dummy memory layers 408, 410, and 402 referred to herein may include one or more dummy memory layers.

As illustrated in FIG. 4B, the reverse programming scheme may apply a pre-charge voltage $V_{pre-charge5}$ to SSG 416 or 418 and an SL voltage $V_{SL}$ to SL 114 to turn on selected NAND memory string 420 and deselected NAND memory string 422 during pre-charge period 403. In certain implementations, SSG driving circuit 128 may apply $V_{pre-charge5}$ to SSG 416 via SSG line 115 connected to selected NAND memory string 420 and deselected NAND memory string 422. In certain other implementations, SL driving circuit 130 may apply $V_{SL}$ to SL 114 connected to selected NAND memory string 420 and deselected NAND memory string 422.

As mentioned above, the reverse programming scheme may include a plurality of programming cycles, one for each of the memory layers in 3D NAND memory device 400. Each of the programming cycles may include, among others, pre-charge period 403 and program period 405. In the example(s) illustrated in FIGS. 4B and 4C, pre-charge period 403 may be the time period between $t_0$ and $t_2$. During pre-charge period 403, a potential difference may be created in channel 424 of one or more of selected NAND memory string 420 or deselected NAND memory string 422. The potential may draw residual electrons in channel 324 (towards the source end (e.g., towards SSG 416 or 418) by applying various pre-charge voltages to different layers across selected NAND memory string 420 and deselected NAND memory string 422. Program period 405 may be the time period between $t_2$ and $t_3$. During program period 405, an associated memory cell in selected NAND memory string 420 may be programmed, and the coupling potential may be generated in deselected NAND memory string 422 to prevent programming a memory cell deselected NAND memory string 322 at the same memory layer.

Referring to FIG. 4B, WL driving circuit 122 may apply a first pre-charge voltage $V_{pre-charge1}$ to first dummy memory layer 408 during pre-charge period 403 in a programming cycle when programming a first memory layer in first set of memory layers 404 (e.g., one of WL0-WLm−1). Furthermore, referring to FIG. 4C, WL driving circuit 122 may apply a second pre-charge voltage $V_{pre-charge2}$ to first dummy memory layer 408 during pre-charge period 403 associated with a programming cycle of a second memory layer (e.g., a memory cell associated with WLm, an edge word line) in first set of memory layers 404 located below the first memory layer (e.g., memory cell associated with one of WL0-WLm−1).

When programming the memory layer associated with WLm, i.e., the memory layer directly adjacent to first dummy memory layer 408, a positive bias voltage during the pre-charge period can exacerbate the CHE injection effect, which is the root of threshold voltage shift at first dummy memory layer 408. Thus, by reducing $V_{pre-charge2}$ applied to first dummy memory layer 408 when programming the memory layer associated with WLm, for example, being smaller than $V_{pre-charge1}$ when programming other memory layer in first set of memory layers 404, the threshold voltage increase at first dummy memory layer 408 can be reduced as well. In other words, by applying a smaller pre-charge voltage to first dummy memory layer 408 when programming the memory layer in first set of memory layers 304 that is directly adjacent to first dummy memory layer 308 than when programming any other memory layers in first set of memory layers 404, the threshold voltage increase at first dummy memory layer 408 can be suppressed.

In some implementations, $V_{pre-charge1}$ may be equal to or larger than the threshold voltage associated with first dummy memory layer 408, e.g., the threshold voltage of the dummy memory cell transistor on first dummy memory layer 408. In contrast, $V_{pre-charge2}$ may be less than the threshold voltage associated with first dummy memory layer 408, such that $V_{pre-charge2}$ is lower compared with $V_{pre-charge1}$ to reduce the threshold voltage increase at first dummy memory layer 408. In some implementations, first dummy memory layer 408 may include multiple dummy memory layers, such as 4 dummy memory layers IDMY_L1 to IDMY_u1 shown in FIG. 4A, each of which is associated with a threshold voltage. In this case, $V_{pre-charge1}$ may be equal to or large than the maximum one of the threshold voltages, while $V_{pre-charge2}$ may be less than the minimum one of the threshold voltages. In some implementations, the threshold voltage(s) may be between 2 V and 3V, and $V_{pre-charge2}$ may be less than or equal to 2 V. In some implementations, $V_{pre-charge2}$ may be less than or equal to 0 V, i.e., a non-positive bias voltage, to avoid attracting and accumulating electrons, which is one cause of CHE injection effect.

Referring to FIG. 4B, WL driving circuit 122 may apply a third pre-charge voltage $V_{pre-charge3}$ to second dummy memory layer 410 during pre-charge period 403 when programming the first memory layer in first set of memory layers 404 (e.g., memory cell associated with one of WL0-WLm−1). Referring to FIG. 4C, WL driving circuit 122 may apply a fourth pre-charge voltage $V_{pre-charge4}$ to second dummy memory layer 410 during pre-charge period 403 when programming the second memory layer (e.g., memory cell associated with WLm).

Furthermore, as seen in FIG. 4B, WL driving circuit 122 may apply a sixth pre-charge voltage $V_{pre-charge6}$ to the first memory layer (in first set of memory layers 404 during pre-charge period 403 when programming the first memory layer. $V_{pre-charge6}$ may be applied in such a way that the potential within channel 424 is enhanced, or at least not affected by the application of $V_{pre-charge6}$. For example, $V_{pre-charge6}$ may be less than or equal to 0 V. Similarly, as seen in FIG. 4C, WL driving circuit 122 may apply a seventh pre-charge voltage $V_{pre-charge7}$ to the second memory layer (e.g., memory cell associated with one of WLm) during pre-charge period 403 when programming the second memory layer. $V_{pre-charge7}$ may be applied in such a way that the potential within channel 424 is enhanced, or at least not affected by the application of $V_{pre-charge7}$. For example, $V_{pre-charge7}$ may be less than or equal to 0 V.

As seen in FIGS. 4B and 4C, during program period 405, for deselected NAND memory string 422, because DSG 414 and SSG 418 at each end thereof are turned off, channel 424 of deselected NAND memory string 422 is in a floating state. Referring to FIG. 4B, during the programming of the first memory layer (e.g., memory cell associated with one of WL0-WLm−1) in selected NAND memory string 420, because the memory layers of memory pages 120 surround both selected NAND memory string 420 and deselected NAND memory string 422, first channel pass voltage $V_{pass1}$ applied to each of the rest of the memory layers forms a coupling potential in deselected NAND memory string 422 to suppress the programming of a memory cell in deselected NAND memory string 422 due to the first program voltage $V_{PGM1}$ used to program a memory cell (e.g., associated with the first memory layer) in selected NAND memory string 420. For example, when $V_{PGM1}$ is applied to WLm−1 to program the associated memory cell in selected NAND memory string 420, $V_{pass1}$ may be applied to WL0-WLm−2, WLm-WLn, and first dummy memory layer 408.

Referring to FIG. 4C, when programming of the second memory layer (e.g., memory cell associated with one of WLm) in selected NAND memory string 420, because the memory layers of memory pages 120 surround both selected NAND memory string 420 and deselected NAND memory string 422, second channel pass voltage $V_{pass2}$ applied to each of the rest of the memory layers forms a coupling potential in deselected NAND memory string 422 to suppress the programming of a memory cell in deselected NAND memory string 422 due to the second program voltage $V_{PGM2}$ used to program a memory cell (e.g., associated with the second memory layer) in selected NAND memory string 420. For example, when $V_{PGM2}$ is applied to WLm to program the associated memory cell in selected NAND memory string 420, $V_{pass2}$ may be applied to WL0-WLm−1, WLm+1-WLn, and first dummy memory layer 408.

Furthermore, in FIGS. 4B and 4C, during program period 405, a deselect voltage (e.g., 0V) may be applied to DSG 414 and SSG 418 to deselect NAND memory string 422 while programming the memory cells of selected NAND memory string 420.

It is understood that when programing each memory layer in second set of memory layers 406 using the reverse programming scheme, the same waveforms shown in FIG. 4C may be applied, e.g., with a reduced pre-charge voltage $V_{pre-charge2}$. That is, the same waveforms shown in FIG. 4C may be used for programming each of the memory layers associated with WLm to WLn, and the same waveforms shown in FIG. 4B may be sued for programming each of the memory layers associated with WL0 to WLm−1.

Figure 5:
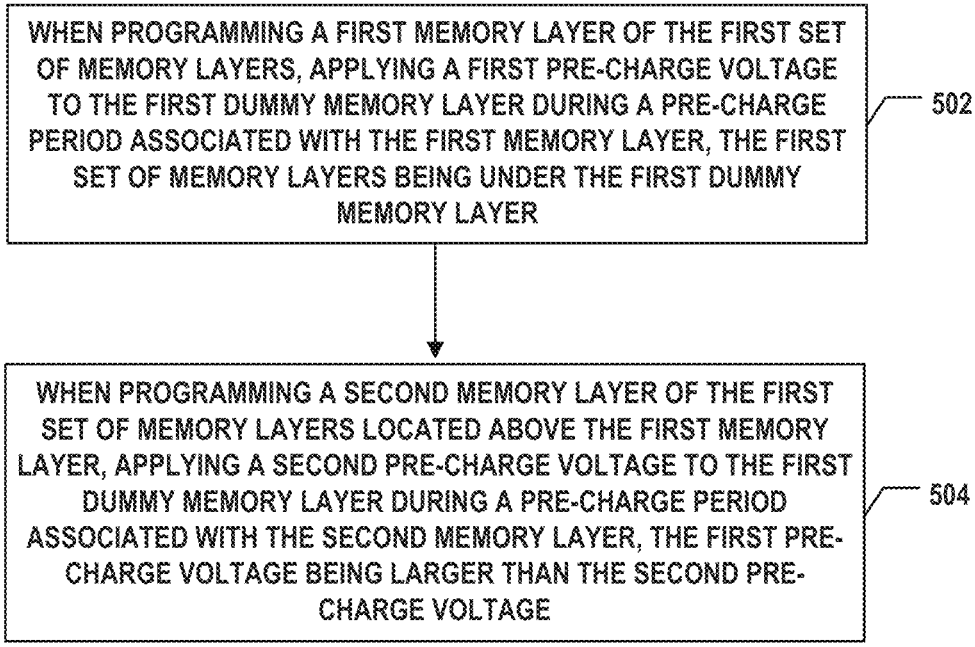
FIG. 5 is a flowchart of an exemplary method for forward pre-charging and programming scheme for a 3D NAND memory device, according to some aspects of the present disclosure.

FIG. 5 is a flowchart of an exemplary method 500 for forward programming a 3D memory device, according to some aspects of the present disclosure. The operations illustrated in FIG. 5 may be performed by a 3D memory device, e.g., such as 3D NAND memory device 300 illustrated in FIG. 3A. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, at 502, when programming a first memory layer of the first set of memory layers, the 3D memory device may apply a first pre-charge voltage to the first dummy memory layer during a pre-charge period associated with the first memory layer. In certain aspects, the first set of memory layers may be under the first dummy memory layer. For example, referring to FIG. 3B, WL driving circuit 122 may apply a first pre-charge voltage $V_{pre-charge1}$ to the first dummy memory layer 308 during pre-charge period 303 associated with a programming cycle of a first memory layer (e.g., a memory cell associated with one of WL0-WLm−1) in first set of memory layers 304.

At 504, when programming a second memory layer of the first set of memory layers located above the first memory layer, the 3D memory device may apply a second pre-charge voltage to the first dummy memory layer during a pre-charge period associated with the second memory layer. In certain aspects, the first pre-charge voltage may be larger than the second pre-charge voltage. For example, referring to FIG. 3C, WL driving circuit 122 may apply a second pre-charge voltage $V_{pre-charge2}$ to first dummy memory layer 308 during pre-charge period 303 associated with a programming cycle of a second memory layer (e.g., a memory cell associated with WLm) in first set of memory layers 304 located above the first memory layer (e.g., memory cell associated with one of WL0-WLm−1). In certain aspects, the first pre-charge voltage may be larger than the second pre-charge voltage.

FIG. 6 is a flowchart of an exemplary method 600 for reverse programming a 3D memory device, according to some aspects of the present disclosure. The operations illustrated in FIG. 6 may be performed by a 3D memory device, e.g., such as 3D NAND memory device 400 illustrated in FIG. 4A. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, at 602, when programming a first memory layer of the first set of memory layers, the 3D memory device may apply a first pre-charge voltage to the first dummy memory layer during a pre-charge period associated with the first memory layer. In certain aspects, the first set of memory layers may be above the first dummy memory layer. For example, referring to FIG. 4B, WL driving circuit 122 may apply a first pre-charge voltage $V_{pre-charge1}$ to the first dummy memory layer 408 during pre-charge period 403 associated with a programming cycle of a first memory layer (e.g., a memory cell associated with one of WL0-WLm−1) in first set of memory layers 404.

At 604, when programming a second memory layer of the first set of memory layers located above the first memory layer, the 3D memory device may apply a second pre-charge voltage to the first dummy memory layer during a pre-charge period associated with the second memory layer. In certain aspects, the first pre-charge voltage may be larger than the second pre-charge voltage. For example, referring to FIG. 4C, WL driving circuit 122 may apply a second pre-charge voltage $V_{pre-charge2}$ to first dummy memory layer 408 during pre-charge period 403 associated with a programming cycle of a second memory layer (e.g., a memory cell associated with WLm) in first set of memory layers 404 located below the first memory layer (e.g., memory cell associated with one of WL0-WLm−1). In certain aspects, the first pre-charge voltage may be larger than the second pre-charge voltage.

According to one aspect of the present disclosure, a 3D memory device is disclosed. For example, in certain aspects, the 3D memory device may include a first set of memory layers, a second set of memory layers above the first set of memory layers, and a first dummy memory layer between the first and second sets of memory layers. In certain other aspects, the 3D memory device may further include a plurality of NAND memory strings each extending through the first and second set of memory layers and the first dummy memory layer. In certain other aspects, the 3D memory device may include a peripheral circuit configured to sequentially program each memory layer of the first set of memory layers, and then sequentially program each memory layer of the second set of memory layers. For example, the peripheral circuit may include a WL driving circuit configured to when programming a first memory layer of the first set of memory layers, apply a first pre-charge voltage to the first dummy memory layer during a pre-charge period associated with the first memory layer. In certain other aspects, the WL driving circuit may be further configured to when programming a second memory layer of the first set of memory layers located above the first memory layer, apply a second pre-charge voltage to the first dummy memory layer during a pre-charge period associated with the second memory layer. In certain aspects, the first pre-charge voltage may be larger than the second pre-charge voltage.

In some implementations, the WL driving circuit may be further configured to when programming the first memory layer, apply a first channel pass voltage to the first dummy memory layer during a program period associated with the first memory layer. In some other implementations, the WL driving circuit may be further configured to when programming the second memory layer, apply a second channel pass voltage to the first dummy memory layer during a program period associated with the second memory layer.

In some implementations, the WL driving circuit may be further configured to when programming the first memory layer, apply a first program voltage to the first memory layer during the program period associated with the first memory layer. In some implementations, the WL driving circuit may be further configured to, when programming the second memory layer, apply a second program voltage to the second memory layer during the program period associated with the second memory layer.

In some implementations, the 3D memory device may further include a second dummy memory layer above the second set of memory layers. In some implementations, the WL driving circuit may be further configured to when programming the first memory layer, apply a third pre-charge voltage to the second dummy memory layer during the pre-charge period associated with the first memory layer. In some implementations, to program the first set of memory layers, the WL driving circuit may be further configured to when programming the second memory layer, apply a fourth pre-charge voltage to the second dummy memory layer during the pre-charge period associated with the second memory layer.

In some implementations, each of the NAND memory strings includes a DSG above the second set of memory layers. The peripheral circuit may further include a DSG driving circuit. In some implementations, the DSG driving circuit may be configured to when programming the first and second memory layers, apply a fifth pre-charge voltage to the DSG of at least one of the NAND memory strings during the pre-charge period associated with the first memory layer and during the pre-charge period associated with the second memory layer, respectively.

In some implementations, the first memory layer of the first set of memory layers may include any memory layer in the first set of memory layers, excluding a memory layer directly adjacent to the first dummy memory layer.

In some implementations, the first dummy memory layer includes a plurality of first dummy memory layers each associated with a threshold voltage. In some implementations, the second pre-charge voltage is less than a minimum one of the threshold voltages, and the first pre-charge voltage is equal to or larger than a maximum one of the threshold voltages.

In some implementations, the second pre-charge voltage is less than or equal to 2 V.

In some implementations, the second pre-charge voltage is less than or equal to 0 V.

According to another aspect of the present disclosure, a 3D memory device is disclosed. In some implementations, the 3D memory device may include a first set of memory layers, a second set of memory layers below the first set of memory layers, and a first dummy memory layer between the first and second sets of memory layers. In some implementations, the 3D memory device may further include a plurality of NAND memory strings each extending through the first and second set of memory layers and the first dummy memory layer. In some implementations, the 3D memory device may further include a peripheral circuit configured to sequentially program each memory layer of the first set of memory layers, and then sequentially program each memory layer of the second set of memory layers. In some implementations, the peripheral circuit includes a WL driving circuit configured to when programming a first memory layer of the first set of memory layers, apply a first pre-charge voltage to the first dummy memory layer during a pre-charge period associated with the first memory layer. In some implementations, the WL driving circuit may be further configured to when programming a second memory layer of the first set of memory layers located below the first memory layer, apply a second pre-charge voltage to the first dummy memory layer during a pre-charge period associated with the second memory layer. In some implementations, the first pre-charge voltage may be larger than the second pre-charge voltage.

In some implementations, the WL driving circuit may be further configured to when programming the first memory layer, apply a first channel pass voltage to the first dummy memory layer during a program period associated with the first memory layer. In some implementations, the WL driving circuit may be further configured to when programming the second memory layer, apply a second channel pass voltage to the first dummy memory layer during a program period associated with the second memory layer.

In some implementations, the WL driving circuit may be further configured to when programming the first memory layer, apply a first program voltage to the first memory layer during the program period associated with the first memory layer. In some implementations, the WL driving circuit may be further configured to when programming the second memory layer, apply a second program voltage to the second memory layer during the program period associated with the second memory layer.

In some implementations, the 3D memory device may further include a second dummy memory layer above the second set of memory layers. In some implementations, to program the first set of memory layers, the WL driving circuit may be further configured to when programming the first memory layer, apply a third pre-charge voltage to the second dummy memory layer during the pre-charge period associated with the first memory layer. In some implementations, the WL driving circuit may be further configured to when programming the second memory layer, apply a fourth pre-charge voltage to the second dummy memory layer during the pre-charge period associated with the second memory layer.

In some implementations, each of the NAND memory strings includes an SSG below the second set of memory layers. In some implementations, the peripheral circuit may further include an SSG driving circuit. In some implementations, the SSG driving circuit may be configured to when programming the first and second memory layers, apply a fifth pre-charge voltage to the SSG of at least one of the NAND memory strings during the pre-charge period associated with the first memory layer and during the pre-charge period associated with the second memory layer, respectively.

In some implementations, the first memory layer of the first set of memory layers may include any memory layer in the first set of memory layers, excluding a memory layer directly adjacent to the first dummy memory layer.

In some implementations, the first dummy memory layer includes a plurality of first dummy memory layers each associated with a threshold voltage. In some implementations, the second pre-charge voltage is less than a minimum one of the threshold voltages, and the first pre-charge voltage is equal to or larger than a maximum one of the threshold voltages.

In some implementations, the second pre-charge voltage is less than or equal to 2 V.

In some implementations, the second pre-charge voltage is less than or equal to 0 V.

According to still another aspect of the present disclosure, a method for operating a 3D memory device. In some implementations, the 3D memory device may include a first set of memory layers, a second set of memory layers above the first set of memory layers, and a first dummy memory layer between the first and second sets of memory layers. In some implementations, the 3D memory device may include a plurality of NAND memory strings each extending through the first and second set of memory layers and the first dummy memory layer. In some implementations, the method may include when programming a first memory layer of the first set of memory layers, applying a first pre-charge voltage to the first dummy memory layer during a pre-charge period associated with the first memory. In some implementations, the method may include when programming a second memory layer of the first set of memory layers located above the first memory layer, applying a second pre-charge voltage to the first dummy memory layer during a pre-charge period associated with the second memory layer of the first set of memory layers located above the first memory layer. In some implementations, the first pre-charge voltage may be larger than the second pre-charge voltage.

In some implementations, the method may further include when programming the first memory layer, applying a first channel pass voltage to the first dummy memory layer during a program period associated with the first memory layer. In some implementations, the method may further include when programming the second memory layer, applying a second channel pass voltage to the first dummy memory layer during a program period associated with the second memory layer.

In some implementations, the method may further include when programming the first memory layer, applying a first program voltage to the first memory layer during the program period associated with the first memory layer. In some implementations, the method may further include when programming the second memory layer, applying a second program voltage to the second memory layer during the program period associated with the second memory layer.

In some implementations, the 3D memory device may further include a second dummy memory layer above the second set of memory layers. In some implementations, the method may further include when programming the first memory layer, applying a third pre-charge voltage to the second dummy memory layer during the pre-charge period associated with the first memory layer. In some implementations, the method may further include when programming the second memory layer, applying a fourth pre-charge voltage to the second dummy memory layer during the pre-charge period associated with the second memory layer.

In some implementations, each of the NAND memory strings includes a DSG above the second set of memory layers. In some implementations, the method may further include when programming the first and second memory layers, applying a fifth pre-charge voltage to the DSG of at least one of the NAND memory strings during the pre-charge period associated with the first memory layer and during the pre-charge period associated with the second memory layer, respectively.

In some implementations, the first memory layer of the first set of memory layers may include any memory layer in the first set of memory layers, excluding a memory layer directly adjacent to the first dummy memory layer.

In some implementations, the first dummy memory layer includes a plurality of first dummy memory layers each associated with a threshold voltage. In some implementations, the second pre-charge voltage is less than a minimum one of the threshold voltages, and the first pre-charge voltage is equal to or larger than a maximum one of the threshold voltages.

In some implementations, the second pre-charge voltage is less than or equal to 2 V.

In some implementations, the second pre-charge voltage is less than or equal to 0 V.

According to yet another aspect of the present disclosure, a method for operating a 3D memory device. In some implementations, the 3D memory device may include a first set of memory layers, a second set of memory layers below the first set of memory layers, and a first dummy memory layer between the first and second sets of memory layers. In some implementations, the 3D memory device may further include a plurality of NAND memory strings each extending through the first and second set of memory layers and the first dummy memory layer. In some implementations, the method may include when programming a first memory layer of the first set of memory layers, applying a first pre-charge voltage to the first dummy memory layer during a pre-charge period associated with the first memory layer. In some implementations, the method may further include when programming a second memory layer of the first set of memory layers located below the first memory layer, applying a second pre-charge voltage to the first dummy memory layer during a pre-charge period associated with the second memory layer. In some implementations, the first pre-charge voltage may be larger than the second pre-charge voltage.

In some implementations, the method may further include when programming the first memory layer, applying a first channel pass voltage to the first dummy memory layer during a program period associated with the first memory layer. In some implementations, to program the first set of memory layers, the method may further include when programming the second memory layer, applying a second channel pass voltage to the first dummy memory layer during a program period associated with the second memory layer.

In some implementations, the method may further include when programming the first memory layer, applying a first program voltage to the first memory layer during the program period associated with the first memory layer. In some implementations, the method may further include when programming the second memory layer, applying a second program voltage to the second memory layer during the program period associated with the second memory layer.

In some implementations, the 3D memory device may further include a second dummy memory layer above the second set of memory layers. In some implementations, the method may further include when programming the first memory layer, applying a third pre-charge voltage to the second dummy memory layer during the pre-charge period associated with the first memory layer. In some implementations, to program the first set of memory layers, the method may further include when programming the second memory layer, applying a fourth pre-charge voltage to the second dummy memory layer during the pre-charge period associated with the second memory layer.

In some implementations, each of the NAND memory strings includes an SSG below the second set of memory layers. In some implementations, the method may further include when programming the first and second memory layers, applying a fifth pre-charge voltage to the SSG of at least one of the NAND memory strings during the pre-charge period associated with the first memory layer and during the pre-charge period associated with the second memory layer, respectively.

In some implementations, the first memory layer of the first set of memory layers may include any memory layer in the first set of memory layers, excluding a memory layer directly adjacent to the first dummy memory layer.

In some implementations, the first dummy memory layer includes a plurality of first dummy memory layers each associated with a threshold voltage. In some implementations, the second pre-charge voltage is less than a minimum one of the threshold voltages, and the first pre-charge voltage is equal to or larger than a maximum one of the threshold voltages.

In some implementations, the second pre-charge voltage is less than or equal to 2 V.

In some implementations, the second pre-charge voltage is less than or equal to 0 V.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a first set of memory layers, a second set of memory layers above the first set of memory layers, and a first dummy memory layer between the first and second sets of memory layers;
a plurality of NAND memory strings each extending through the first and second sets of memory layers and the first dummy memory layer; and
a peripheral circuit configured to sequentially program each memory layer of the first set of memory layers, and then sequentially program each memory layer of the second set of memory layers,
wherein the peripheral circuit comprises a word line (WL) driving circuit configured to:
when programming a first memory layer of the first set of memory layers, apply a first pre-charge voltage to the first dummy memory layer during a pre-charge period associated with the first memory layer; and
when programming a second memory layer of the first set of memory layers located above the first memory layer, apply a second pre-charge voltage to the first dummy memory layer during a pre-charge period associated with the second memory layer, the first pre-charge voltage being larger than the second pre-charge voltage.

2. The 3D memory device of claim 1, wherein the WL driving circuit is further configured to:
when programming the first memory layer, apply a first channel pass voltage to the first dummy memory layer during a program period associated with the first memory layer; and
when programming the second memory layer, apply a second channel pass voltage to the first dummy memory layer during a program period associated with the second memory layer.

3. The 3D memory device of claim 2, wherein the WL driving circuit is further configured to:
when programming the first memory layer, apply a first program voltage to the first memory layer during the program period associated with the first memory layer; and
when programming the second memory layer, apply a second program voltage to the second memory layer during the program period associated with the second memory layer.

4. The 3D memory device of claim 3, further comprising a second dummy memory layer above the second set of memory layers, wherein the WL driving circuit is further configured to:
when programming the first memory layer, apply a third pre-charge voltage to the second dummy memory layer during the pre-charge period associated with the first memory layer; and
when programming the second memory layer, apply a fourth pre-charge voltage to the second dummy memory layer during the pre-charge period associated with the second memory layer.

5. The 3D memory device of claim 4, wherein each of the NAND memory strings comprises a drain select gate (DSG) above the second set of memory layers, and the peripheral circuit further comprises a DSG driving circuit configured to:
when programming the first and second memory layers, apply a fifth pre-charge voltage to the DSG of at least one of the NAND memory strings during the pre-charge period associated with the first memory layer and during the pre-charge period associated with the second memory layer, respectively.

6. The 3D memory device of claim 1, wherein the first memory layer of the first set of memory layers includes any memory layer in the first set of memory layers, excluding a memory layer directly adjacent to the first dummy memory layer.

7. The 3D memory device of claim 1, wherein
the first dummy memory layer comprises a plurality of first dummy memory layers each associated with a threshold voltage;
the second pre-charge voltage is less than a minimum one of the threshold voltages; and
the first pre-charge voltage is equal to or larger than a maximum one of the threshold voltages.

8. The 3D memory device of claim 7, wherein the second pre-charge voltage is less than or equal to 2 V.

9. The 3D memory device of claim 8, wherein the second pre-charge voltage is less than or equal to 0 V.

10. The 3D memory device of claim 1, further comprising:
a second set of memory layers located on an other side the first set of memory layers; and
a second dummy memory layer located on one side of the second set of memory layers opposite to the first dummy memory layer,
wherein the WL driving circuit is further configured to:
when programming the first memory layer, apply a third pre-charge voltage to the second dummy memory layer during the pre-charge period associated with the first memory layer; and
when programming the second memory layer, apply a fourth pre-charge voltage to the second dummy memory layer during the pre-charge period associated with the second memory layer.

11. The 3D memory device of claim 10, wherein each memory string comprises a drain select gate (DSG) located on the one side of the second set of memory layers, and the peripheral circuit further comprises a DSG driving circuit configured to:
when programming the first memory layer or the second memory layer, apply a fifth pre-charge voltage to the DSG of at least one of the memory strings during the pre-charge period associated with the first memory layer or the second memory layer.

12. A method for operating a three-dimensional (3D) memory device, wherein the 3D memory device comprises a first set of memory layers, a second set of memory layers above the first set of memory layers, and a first dummy memory layer between the first and second sets of memory layers, and a plurality of NAND memory strings each extending through the first and second sets of memory layers and the first dummy memory layer, the method comprising:
when programming a first memory layer of the first set of memory layers, applying a first pre-charge voltage to the first dummy memory layer during a pre-charge period associated with the first memory layer; and when programming a second memory layer of the first set of memory layers located above the first memory layer, applying a second pre-charge voltage to the first dummy memory layer during a pre-charge period associated with the second memory layer, the first pre-charge voltage being larger than the second pre-charge voltage.

13. The method of claim 12, wherein the first memory layer of the first set of memory layers includes any memory layer in the first set of memory layers, excluding a memory layer directly adjacent to the first dummy memory layer.

14. A three-dimensional (3D) memory device, comprising:
a first dummy memory layer
a first set of memory layers located on one side of the first dummy layer;
a plurality of memory strings each extending through the first set of memory layers and the first dummy memory layer; and
a word line (WL) driving circuit configured to:
when programming a first memory layer of the first set of memory layers, apply a first pre-charge voltage to the first dummy memory layer during a pre-charge period associated with the first memory layer; and
when programming a second memory layer of the first set of memory layers located directly adjacent to the first dummy memory layer, apply a second pre-charge voltage to the first dummy memory layer during a pre-charge period associated with the second memory layer, the first pre-charge voltage being larger than the second pre-charge voltage.

15. The 3D memory device of claim 14, wherein the WL driving circuit is further configured to:

when programming the first memory layer, apply a first channel pass voltage to the first dummy memory layer during a program period associated with the first memory layer; and when programming the second memory layer, apply a second channel pass voltage to the first dummy memory layer during a program period associated with the second memory layer.

16. The 3D memory device of claim 15, wherein the WL driving circuit is further configured to:

when programming the first memory layer, apply a first program voltage to the first memory layer during the program period associated with the first memory layer; and when programming the second memory layer, apply a second program voltage to the second memory layer during the program period associated with the second memory layer.

17. The 3D memory device of claim 14, wherein the second memory layer of the first set of memory layers is sandwiched between the first memory layer of the first set of memory layers and the first dummy memory layer.

18. The 3D memory device of claim 14, wherein
the first dummy memory layer comprises a plurality of first dummy memory layers each associated with a threshold voltage;
the second pre-charge voltage is less than a minimum one of the threshold voltages; and
the first pre-charge voltage is equal to or larger than a maximum one of the threshold voltages.

19. The 3D memory device of claim 18, wherein the second pre-charge voltage is less than or equal to 2 V.

20. The 3D memory device of claim 19, wherein the second pre-charge voltage is less than or equal to 0 V.

* * * * *